(12) United States Patent
Shiraishi

(10) Patent No.: US 8,355,075 B2
(45) Date of Patent: Jan. 15, 2013

(54) CAMERA MODULE AND MOBILE TERMINAL UNIT

(75) Inventor: Satoshi Shiraishi, Nagano (JP)

(73) Assignee: Shinko Electric Industries Inc., Ltd., Nagano-shi (JP)

( * ) Notice: Subject to any disclaimer, the term of this patent is extended or adjusted under 35 U.S.C. 154(b) by 527 days.

(21) Appl. No.: 12/188,546

(22) Filed: Aug. 8, 2008

(65) Prior Publication Data

US 2009/0051774 A1 Feb. 26, 2009

(30) Foreign Application Priority Data

Aug. 21, 2007 (JP) ................................ 2007-214358

(51) Int. Cl.
*H04N 5/225* (2006.01)
*H01L 31/0203* (2006.01)

(52) U.S. Cl. .................... 348/374; 348/340; 257/432

(58) Field of Classification Search ............... 396/133, 396/144; 348/340, 335, 373–375; 257/432–435
See application file for complete search history.

(56) References Cited

U.S. PATENT DOCUMENTS

| | | | | |
|---|---|---|---|---|
| 7,361,880 B2 * | 4/2008 | Webster | ...................... | 250/208.1 |
| 7,515,817 B2 | 4/2009 | Shiraishi et al. | ................ | 396/89 |
| 7,619,684 B2 * | 11/2009 | Nishida et al. | ................ | 348/374 |
| 7,782,391 B2 * | 8/2010 | Lin | ................ | 348/340 |
| 2002/0140836 A1 * | 10/2002 | Miyake et al. | ................ | 348/340 |
| 2004/0135475 A1 * | 7/2004 | Omata et al. | .................. | 310/367 |
| 2005/0129384 A1 * | 6/2005 | Nishida et al. | ................ | 385/147 |
| 2005/0174469 A1 * | 8/2005 | Cho et al. | ...................... | 348/340 |
| 2005/0213251 A1 * | 9/2005 | Hanyu | ....................... | 360/236.1 |
| 2006/0181633 A1 * | 8/2006 | Seo | ................. | 348/340 |
| 2007/0019101 A1 * | 1/2007 | Minamio et al. | ............. | 348/335 |
| 2007/0076114 A1 * | 4/2007 | Tsai | ............................. | 348/335 |
| 2007/0110424 A1 * | 5/2007 | Iijima et al. | ................... | 396/133 |

FOREIGN PATENT DOCUMENTS

| | | |
|---|---|---|
| EP | 1 531 617 A1 | 5/2005 |
| JP | 2005-148197 A1 | 6/2005 |
| JP | 2005-175971 | 6/2005 |
| JP | 2006-310949 | 11/2006 |
| JP | 2007-060530 | 3/2007 |

OTHER PUBLICATIONS

Office Action dated Apr. 7, 2009 issued in corresponding Japanese Patent Application No. 2007-214358.

* cited by examiner

*Primary Examiner* — John Villecco
*Assistant Examiner* — Selam Gebriel
(74) *Attorney, Agent, or Firm* — Kratz, Quintos & Hanson, LLP

(57) ABSTRACT

A camera module of the present invention includes a wiring substrate having a connection pad, and on which an imaging device is mounted, on an upper surface side thereof, and a lens unit provided on the wiring substrate and equipped with a lens portion arranged over the imaging device, an actuator (voice coil motor) for driving the lens portion, and projected connection terminal protruding downward and connected to the actuator. The projected connection terminal of the lens unit is arranged on the connection pad of the wiring substrate, and the connection pad and the projected connection terminal are joined mutually by a conductive adhesive agent.

6 Claims, 5 Drawing Sheets

(inside)   (outside)

CAMERA MODULE AND MOBILE TERMINAL UNIT

CROSS-REFERENCE TO RELATED APPLICATIONS

This application is based on and claims priority of Japanese Patent Application No. 2007-214358 filed on Aug. 21, 2007, the entire contents of which are incorporated herein by reference.

BACKGROUND OF THE INVENTION

1. Field of the Invention

The present invention relates to a camera module and a mobile terminal unit and, more particularly, a camera module applicable to a camera with an autofocus function built in a mobile phone, or the like and a mobile terminal unit equipped with the same.

2. Description of the Related Art

In the prior art, a camera module for constituting a camera portion of a mobile phone has been developed. In such camera module, increasing a range of functions such as autofocus, exposure control, and the like is demanded like a digital camera.

As shown in FIG. 1, an example of a camera module in the prior art is basically constructed such that a lens unit 200 equipped with a lens group, an actuator for driving the lens group in an optical axis, etc. is provided onto a wiring substrate 100 on which an imaging device, etc. are mounted.

Also, one terminals of a flexible wiring board 300 are connected to terminals on a side surface of the lens unit 200, and the other terminals of the flexible wiring board 300 and terminals on a lower surface of the wiring substrate 100 are connected via a connector 400. For example, terminals on both sides of the connector 400 are inserted into sockets provided to the flexible wiring board 300 and the wiring substrate 100 respectively and are connected to them. In this manner, the lens unit 200 is connected electrically to the wiring substrate 100.

In Patent Literature 1 (Patent Application Publication (KOKAI) 2005-148197), it is set forth that, in the imaging device applied to the mobile phone, an external member is brought into contact with the imaging device to be assembled, thus an optical system supporting body guiding portion secured to the external member can always be kept perpendicularly to the surface of the imaging device, whereby a degree of perpendicularity between the surface of the imaging device and the optical axis of the imaging optical system can be ensured.

However, in the above connecting method between the wiring substrate 100 and the lens unit 200 in FIG. 1, since the flexible wiring board 300 and the connector 400 are used and they are connected, a size of the product is often increased, and the above connecting method cannot easily respond to the demand for miniaturization.

Also, the flexible wiring board 300 and the connector 400 are prepared particularly, and also the socket, etc. must be provided on the lower surface of the wiring substrate 100. Therefore, the number of components is increased, and also the terminal structure of the wiring substrate 100 is restricted. As a result, it is difficult to achieve a lower cost of the camera module.

SUMMARY OF THE INVENTION

It is an object of the present invention to provide a camera module capable of achieving miniaturization and a lower cost and a mobile terminal unit equipped with the same.

The present invention relates to a camera module, which includes a wiring substrate having a connection pad, and on which an imaging device is mounted, on an upper surface side thereof; and a lens unit provided on the wiring substrate, and equipped with a lens portion arranged over the imaging device, an actuator for driving the lens portion, and projected connection terminal protruding downward and connected to the actuator; wherein the projected connection terminal of the lens unit is arranged on the connection pad of the wiring substrate, and the connection pad and the projected connection terminal are joined mutually by a conductive adhesive agent.

In the camera module of the present invention, the lens unit equipped with the lens portion and the actuator (the voice coil motor, or the like) for driving this lens portion is provided on the wiring substrate on which the imaging device is mounted. In the wiring substrate, the connection pads are provided on the upper surface side thereof as the external connection terminals. Also in the lens unit, the projected connection terminals are provided on the lower surface side thereof as the external connection terminals.

Also, upon placing the lens unit on the wiring substrate, the projected connection terminals of the lens unit are arranged on the connection pads of the wiring substrate to oppose to them, and then the projected connection terminals are joined to the connection pads of the wiring substrate via the conductive adhesive agent (the conductive paste, or the like).

In the present invention, the projected connection terminals are provided on the lower side of the lens unit, and the connection pads are provided on the upper surface side of the wiring substrate, and then they are joined to each other. Therefore, a size of the camera module is decided depending upon sizes of the lens unit and the wiring substrate.

Accordingly, unlike the case in which the terminals on the side surface of the lens unit and the terminals on the lower surface of the wiring substrate are connected by using the flexible wiring board and the connector in the prior art, such a situation can be avoided that the camera module should be increased in size unnecessarily, and miniaturization can be attained.

Also, the flexible wiring board or the connector for connecting the wiring substrate and the lens unit can be omitted and the number of components can be reduced. In addition, there is no need to provide particularly the terminals such as the socket on the lower surface of the wiring substrate, and the common connection pads may be provided on the upper surface side. In this manner, the connection structure between the wiring substrate and the lens unit can be simplified, and a lower cost can be attained rather than the prior art. In the above invention, it is preferable that the connection pads should be arranged on bottom portions of recess portions provided in the wiring substrate, and the conductive adhesive agent should be filled in the recess portions on the connection pads. According to this, since the conductive adhesive agent is filled in the recess portion on the connection pads, adhesion between the conductive adhesive agent and the connection pads can be enhanced by the anchor effect. Therefore reliability of the connection of the camera module can be improved.

Also, in the preferred mode of the present invention, an image processing device for processing image information of the imaging device is further mounted on the wiring substrate, and the connection pads of the wiring substrate are connected to the image processing device.

Also, the actuator in the lens unit is a voice coil motor that is constructed by a coil and a magnet, and the projected connection terminals of the lens unit are connected to the coil.

As explained above, in the camera module of the present invention, since the structure for connecting the wiring substrate and the lens unit can be simplified, miniaturization and a lower cost can be achieved.

DETAILED DESCRIPTION OF THE PREFERRED EMBODIMENT

An embodiment of the present invention will be explained with reference to the accompanying drawings hereinafter.

Figure 1:
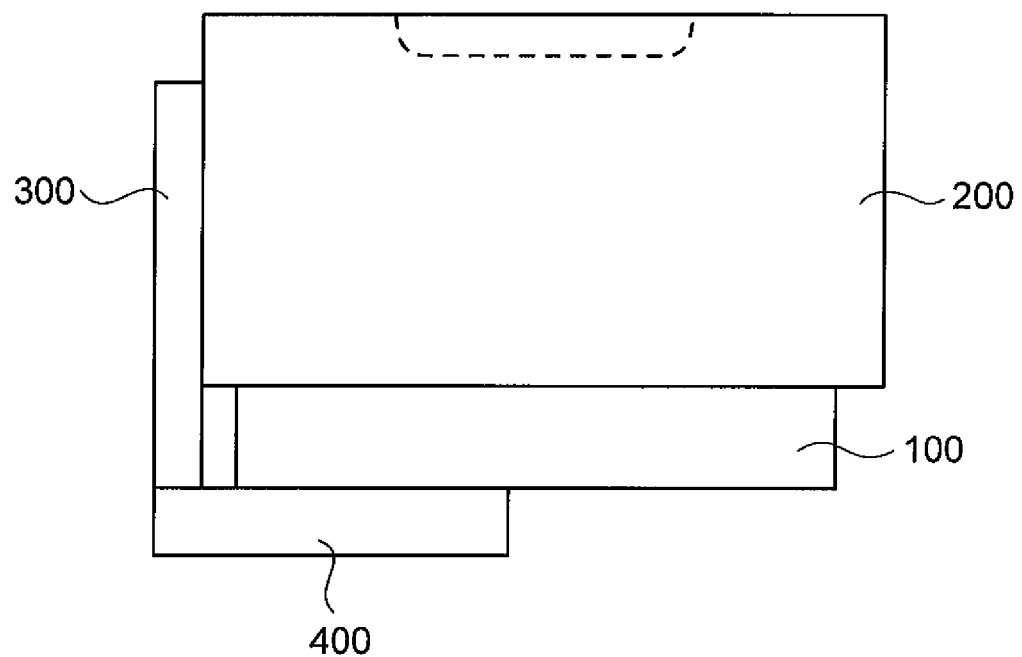
FIG. 1 is a sectional view showing an example of a camera module in the prior art.
Figure 2:
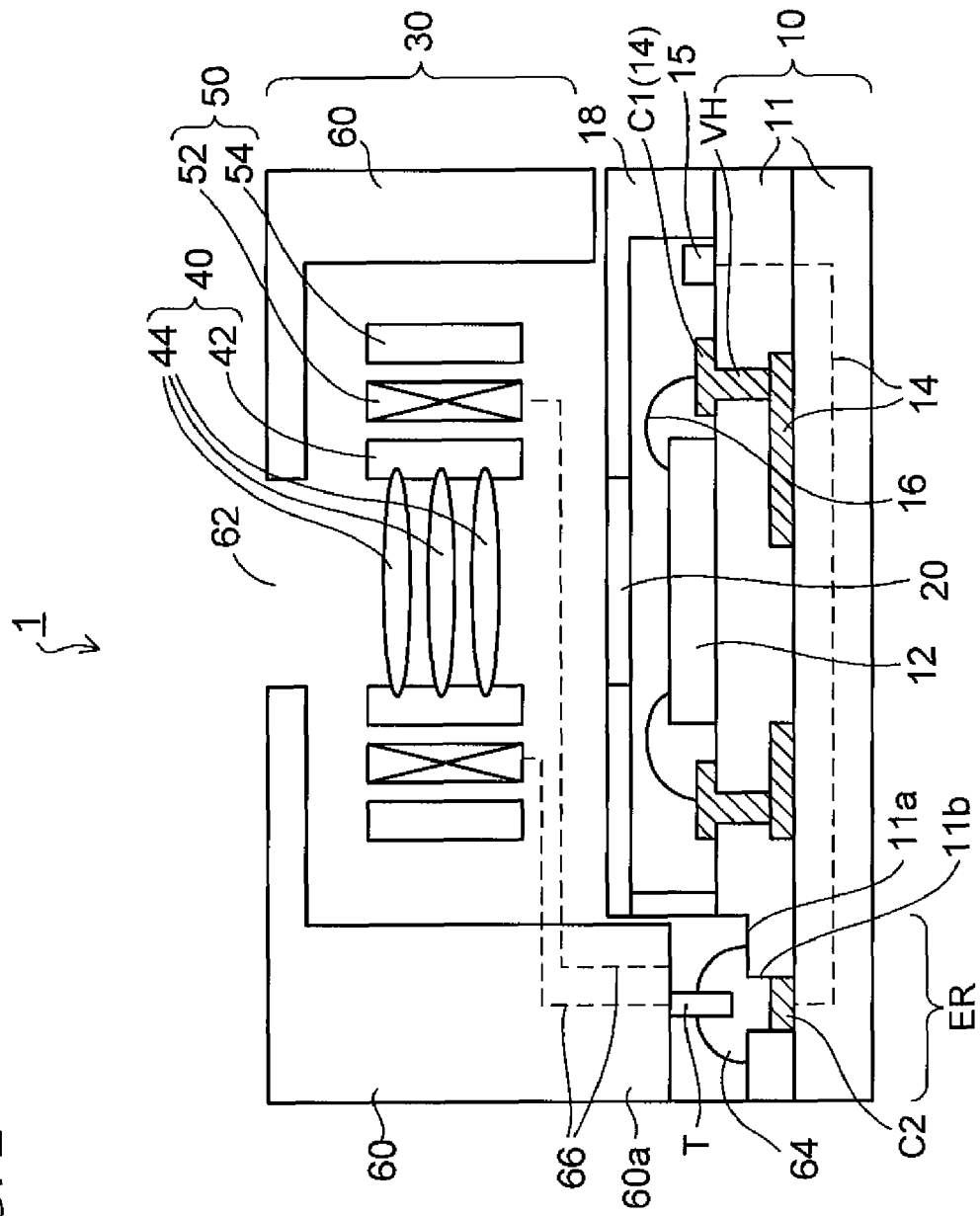
FIG. 2 is a sectional view showing schematically a configuration of a camera module of an embodiment of the present invention.
Figure 3:
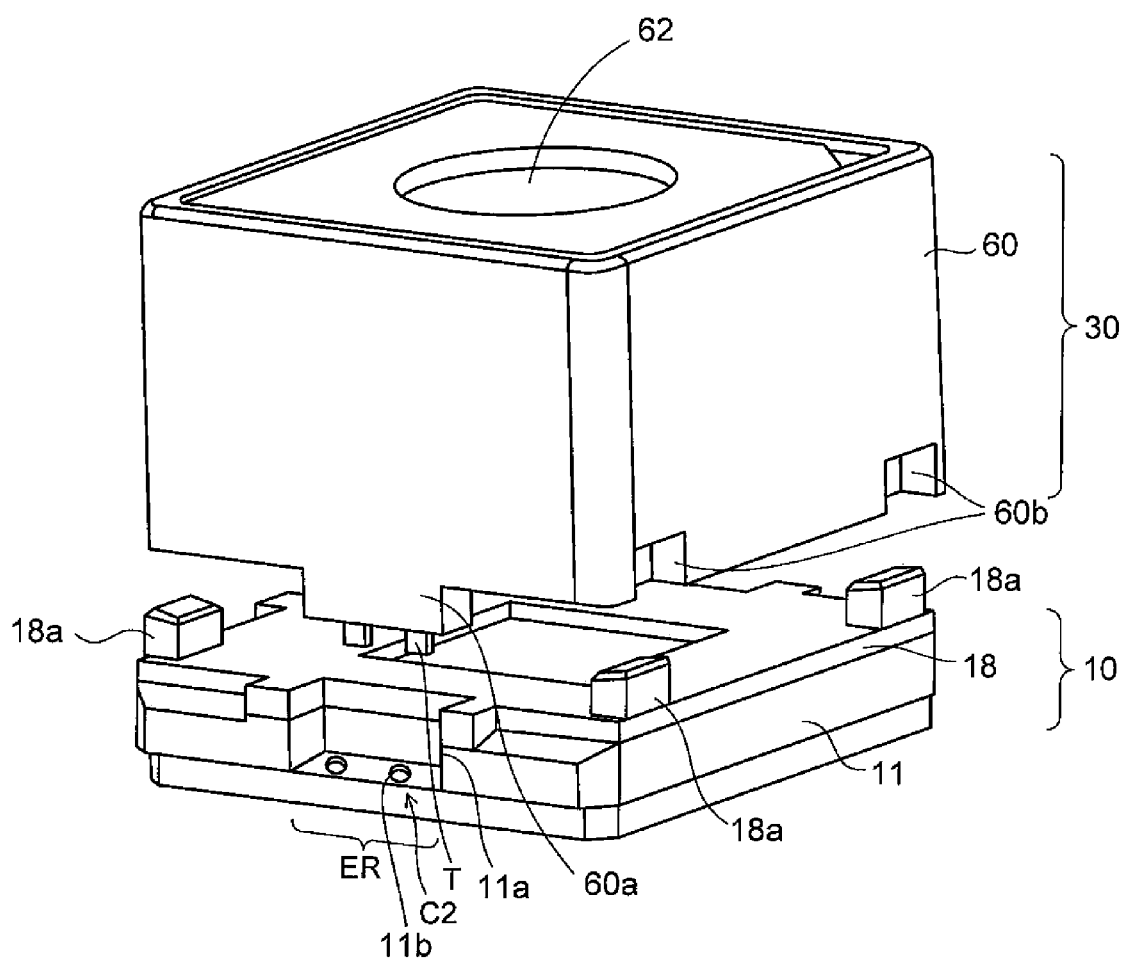
FIG. 3 is a perspective view showing a situation that a lens unit is arranged on a wiring substrate in the camera module in FIG. 2.

FIG. 2 is a sectional view showing schematically a configuration of a camera module of an embodiment of the present invention, and FIG. 3 is a perspective view showing a situation that a lens unit is arranged on a wiring substrate in the camera module in FIG. 2.

As shown in FIG. 2, in a wiring substrate 10 of a camera module 1 of the present embodiment, a plurality of wiring layers 14 connected mutually through via hole VH are stacked and built in an insulating substrate 11 made of a resin, or the like, and the uppermost wiring layer 14 serves as connection portions C1. An imaging device 12 such as a CCD, a CMOS sensor, or the like is mounted on the wiring substrate 10, and electrodes of the imaging device 12 are connected to the connection portions C1 of the wiring substrate 10 via wires 16. Also, an image processing device 15 such as a DSP (Digital Signal Processor), or the like connected to the imaging device 12 to process image information is mounted on the wiring substrate 10.

A notched stepped portion 11a is provided in one end portion of the wiring substrate 10, and an external connection area ER of the wiring substrate 10 is arranged there. A connection pad C2 connected to the wiring layers 14 is formed in the external connection area ER. Also, recess portions 11b are provided by opening the portions of the insulating substrate 11 on the connection pads C2, and the connection pad C2 is placed on the bottom portion of the recess portion 11b.

Also, the image processing device 15 is connected to the connection pads C2 via the wiring layers 14. In this manner, the imaging device 12 is connected electrically to the connection pads C2 via the image processing device 15.

Also, a frame-like supporting portion 18 in which an opening portion is formed in the center portion is provided on the outer peripheral portion of the imaging device 12 such that the imaging device 12 is housed. Also, the opening portion of the frame-like supporting portion 18 is sealed with a glass plate 20.

Also, a lens unit 30 is provided on the frame-like supporting portion 18. The lens unit 30 is basically constructed by a lens portion 40, a voice coil motor (VCM) 50 as an actuator for driving the lens portion 40, and an outer frame portion 60 for supporting these elements.

The lens portion 40 is constructed by a cylindrical supporting body 42 arranged over the imaging device 12, and a lens group 44 composed of plural lenses and held in the supporting body 42 and aligned in the vertical direction.

The voice coil motor 50 for driving the lens portion 40 in the optical axis direction (the vertical side in FIG. 2) is provided on the outer peripheral side of the lens portion 40. The voice coil motor 50 is constructed by a coil 52 wound on the outer periphery of the supporting body 42 of the lens portion 40, and a magnet 54 arranged on the outer peripheral side of the coil 52.

Then, when a predetermined current is fed through the coil 52, the lens portion 40 can be driven to receive a trust force in the optical axis direction based on the principle of the so-called linear motor. That is, the lens portion 40 is driven back and forth by a function of the voice coil motor 50, and thus a focus of the image is controlled, etc. A spring (not shown) is fitted in the lens portion 40, and the lens portion 40 can be returned to a normal position by a spring force.

Here, in an example in FIG. 2, the voice coil motor 50 is illustrated as the actuator to drive the lens portion 40. But the lens portion 40 may be driven by utilizing a piezo motor (not shown) as the actuator. In the piezo motor, expansion/contraction of the crystal occurs when a voltage is applied to the piezoelectric element by utilizing an inverse piezoelectric effect, and as a result the lens portion 40 can be driven.

Also, the outer frame portion 60 for supporting the lens portion 40, the coil 52, and the magnet 54 is arranged on the outside of the magnet 54 of the voice coil motor 50. An opening portion 62 is provided in the center portion of a top surface of the outer frame portion 60. The opening portion 62 of the outer frame portion 60 may be sealed with a glass window that is optically isotropic.

Also, projected connection terminals T protruded downward are provided on the lower surface of the outer frame portion 60 of the lens unit 30. The projected connection terminals T are connected to the coil 52 of the voice coil motor 50 via wirings 66, and a current is supplied to the coil 52 from the projected connection terminals T. The projected connection terminal T is made of a metal such as a nickel silver (an alloy of copper/nickel/zinc), or the like.

In FIG. 3, it is shown a situation that the lens unit 30 in FIG. 2 is arranged on the wiring substrate 10. In FIG. 3, the imaging device 12 in FIG. 2 is omitted from the illustration.

By reference to FIG. 3 together with FIG. 2, projection portions 1a protruded upward are provided at four corners of the frame-like supporting portion 18 on the wiring substrate 10. Also, notched portions 60b corresponding to the projection portions 18a of the frame-like supporting portion 18 are provided to both end portions of an under side of a pair of opposing outer surfaces of the outer frame portion 60 of the lens unit 30. Also, the lens unit 30 is arranged on the frame-like supporting portion 18 on the wiring substrate 10 in a situation that the notched portions 60b of the outer frame portion 60 of the lens unit 30 are fitted to the projection portions 18a of the frame-like supporting portion 18 respectively.

Also, in the lower surface of the outer frame portion 60 of the lens unit 30, projection portions 60a protruded downward are provided to the portions corresponding to the notched stepped portions 11a of the wiring substrate 10. Also, two projected connection terminals T mentioned above are provided on the lower surface of the projection portion 60a. The projection portions 60a of the outer frame portion 60 of the lens unit 30 are fitted into the notched stepped portions 11a of the wiring substrate 10, and the projected connection terminals T of the lens unit 30 are arranged over the recess portions 11b of the wiring substrate 10, thereby such a condition is obtained that the projected connection terminals T oppose to the connection pads C2 on the bottom portions of the recess portions 11b (FIG. 2).

At this time, a conductive paste 64 (conductive adhesive agent) such as a silver paste, or the like is coated on the connection pads C2 of the wiring substrate 10. And the projected connection terminals T of the lens unit 30 are stuck in the conductive paste 64 (FIG. 2).

Then, the conductive paste 64 is cured by applying a heat treatment. Accordingly, the projected connection terminals T of the lens unit 30 are connected electrically to the connection pads C2 of the wiring substrate 10 via the conductive paste 64. Here, the conductive paste 64 is illustrated as the conductive adhesive agent, but a solder, or the like may be used.

When the piezo motor is used as the actuator to drive the lens unit 30, five projected connection terminals T connected to the piezo motor are provided to the lens unit 30. Similarly, five projected connection terminals T are joined to five connection pads C2 of the wiring substrate 10 by the conductive paste 64 respectively.

Figure 4:
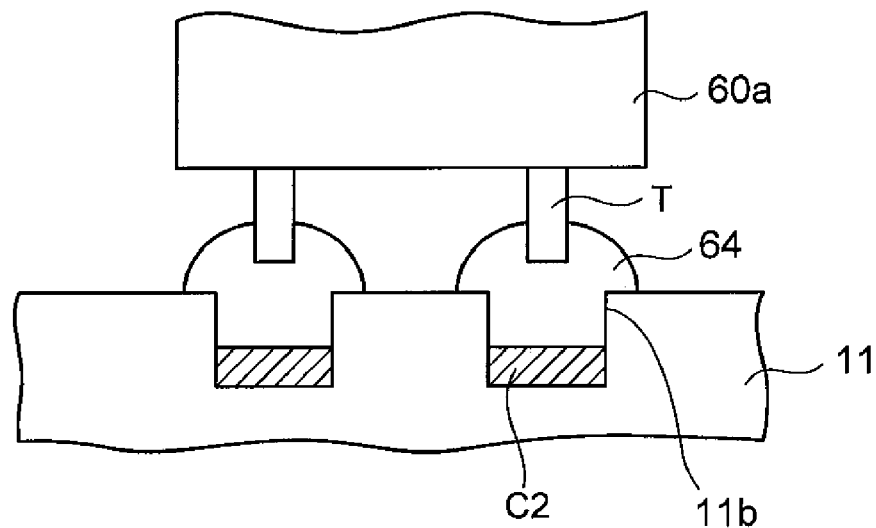
FIG. 4 is a sectional view (#1) showing a situation that projected connection terminals of the lens unit and connection pads of the wiring substrate are joined mutually by a conductive paste in the camera module of the embodiment of the present invention.

In FIG. 4, it is shown a situation that two projected connection terminals T on the lower surface of the lens unit 30 are connected electrically to the connection pads C2 of the wiring substrate 10 by the conductive paste 64.

In an example in FIG. 4, the projected connection terminals T of the lens unit 30 do not contact the connection pads C2 on the bottom portions of the recess portions 11b of the wiring substrate 10. The conductive paste 64 is interposed between top ends of the projected connection terminals T and the upper surfaces of the connection pads C2.

Since the connection pads C2 are arranged on the bottom portions of the recess portions 11b of the wiring substrate 10, the conductive paste 64 is filled in the recess portions 11b on the connection pads C2. Therefore, adhesion between the conductive paste 64 and the connection pads C2 can be improved by the anchor effect, and particularly the adhesion can withstand a mechanical stress applied from the lateral direction.

Figure 5:
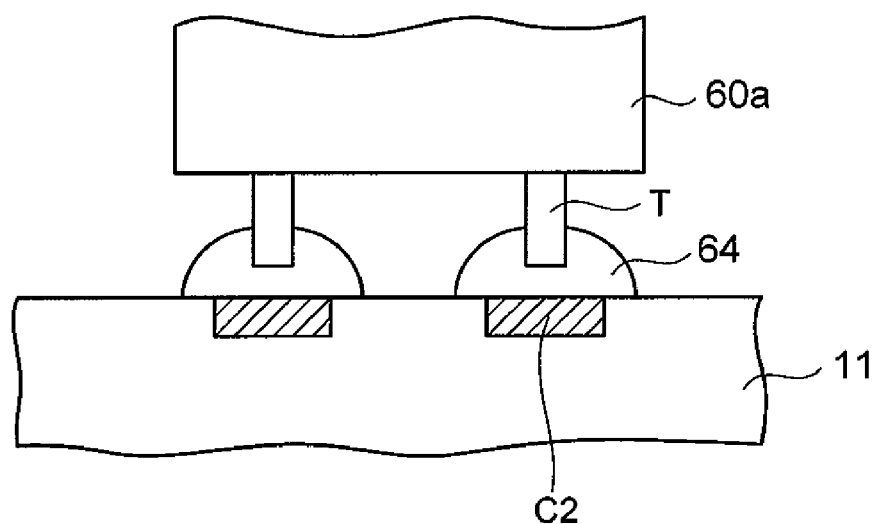
FIG. 5 is a sectional view (#2) showing a situation that projected connection terminals of the lens unit and connection pads of the wiring substrate are joined mutually by a conductive paste in the camera module of the embodiment of the present invention.

Here, as shown in FIG. 5, when the adhesion of the conductive paste 64 does not become an issue, the recess portions 11b provided on the connection pads C2 of the wiring substrate 10 may be omitted. In this case, the connection pads C2 are buried on the bottom surfaces of the notched stepped portions 11a (FIG. 2) of the wiring substrate 10, and the projected connection terminals T of the lens unit 30 and the connection pads C2 of the wiring substrate 10 are joined mutually via the conductive paste 64 in a state that no recess portion is provided on the connection pads CR.

Also, in FIG. 4 and FIG. 5, the projected connection terminals T of the lens unit 30 do not contact the connection pads C2 of the wiring substrate 10. But it is all right that they are brought into contact with each other such an extent that the projected connection terminals T are not disconnected.

As shown in FIG. 2, in the camera module 1 of the present embodiment, a natural light transmits the lens group 44 of the lens unit 30 and then transmits the underlying glass plate 20. At this time, the glass plate 20 functions as the IR cut-off filter that removes a light in an IR (infrared) region except a visible light from the natural light.

Further, a light transmitted from the glass plate 20 is incident on the imaging device 12, and the imaging device 12 converts a light signal into an electric signal. Then, image information in the imaging device 12 is sent to the image processing device 15, and the image processing is performed there. When the focus of the image does not suit, an electric current is supplied from the image processing device 15 to the coil 52 of the voice coil motor 50 via the connection pads C2 of the wiring substrate 10 and the projected connection terminals T of the lens unit 30, or the like so as to change a position of the lens portion 40. Accordingly, the position of the lens portion 40 is changed by a function of the voice coil motor 50, and thus a focus is adjusted.

In the camera module 1 of the present embodiment, as the terminal for supplying an electric current to the coil 52 of the voice coil motor 50 of the lens unit 30, the projected connection terminals T are provided to the lower surface of the outer frame portion 60 of the lens unit 30. Upon fitting the lens unit 30 in the wiring substrate 10 to join together, the connection pads C2 are provided on the upper surface side of the wiring substrate 10 corresponding to the projected connection terminals T of the lens unit 30, and then the projected connection terminals T of the lens unit 30 are joined to the connection pads C2 of the wiring substrate 10 via the conductive paste 64.

By doing so, unlike the prior art, it is not needed that the terminals are provided to the side surfaces of the lens unit 30 and then these terminals are connected to the terminals on the lower surface of the wiring substrate 10 via the flexible wiring board and the connector. That is, the projected connection terminals T are provided on the lower side of the lens unit 30 and the connection pads C2 are provided on the upper surface side of the wiring substrate 10, so that a size of the camera module 1 is decided depending upon sizes of the lens unit 30 and the wiring substrate 10. Therefore, such a situation can be avoided that the camera module should be increased in size unnecessarily, and miniaturization can be attained.

Also, since the projected connection terminals T of the lens unit 30 and the connection pads C2 of the wiring substrate 10 are joined mutually by the conductive paste 64 (or the solder), the flexible wiring board and the connector can be omitted and the number of components can be reduced. In addition, there is no need to provide particularly the terminals such as the socket on the lower surface of the wiring substrate 10, and the common connection pads C2 may be provided on the upper surface side. As a result, the connection structure between the wiring substrate 10 and the lens unit 30 can be simplified rather than the prior art, and a lower cost can be attained.

Figure 6:
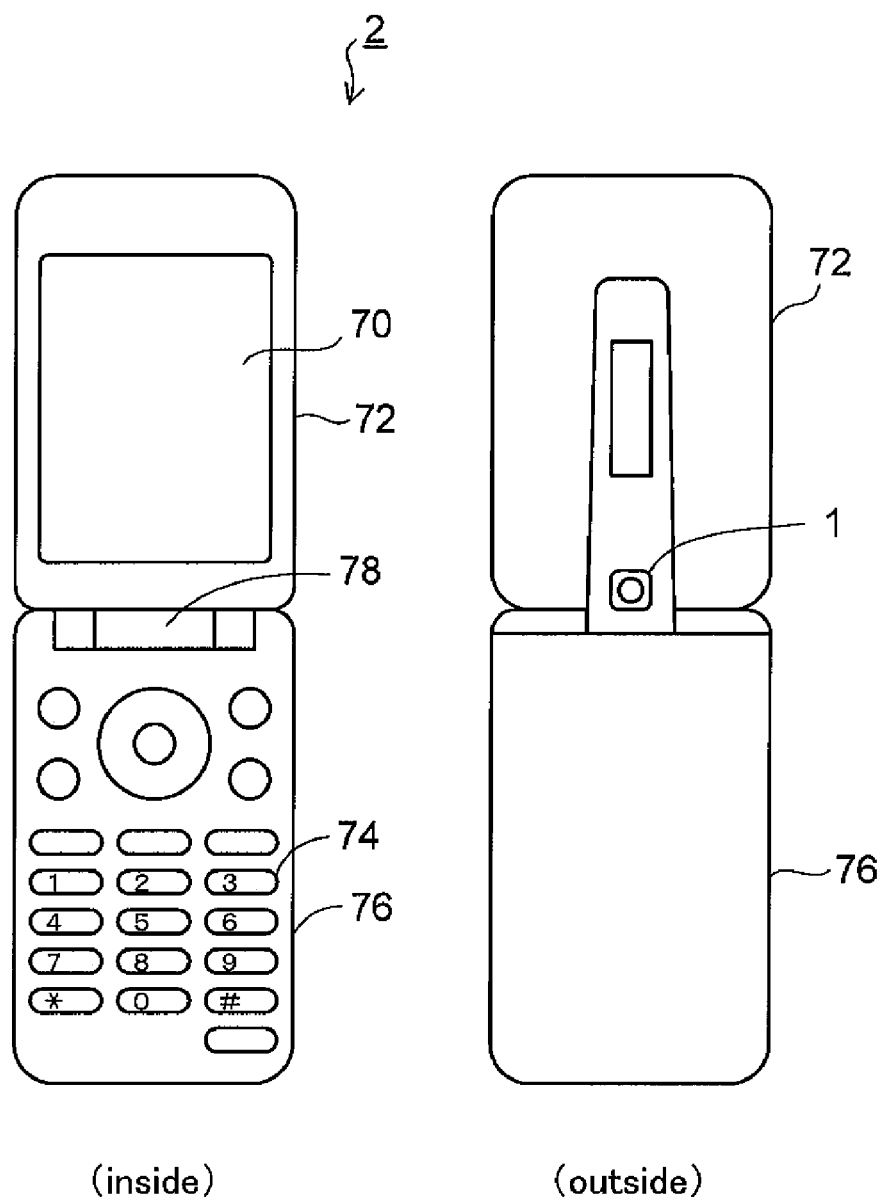
FIG. 6 is an external view showing a mobile phone equipped with the camera module of the embodiment of the present invention.

In FIG. 6, a mobile phone 2 (mobile terminal unit) in which the camera module 1 of the present embodiment is built is shown. As shown in an inside view in FIG. 6, in the mobile phone 2 of the present embodiment, an upper case 72 equipped with a display screen 70 and a lower case 76 equipped with operation buttons 74 etc. are coupled by a coupling portion 78 in a foldable state.

Also, as shown in an outside view in FIG. 6, the above camera module 1 of the present embodiment is arranged under the display screen 70 of the upper case 72. The camera module 1 is incorporated into the upper case 72 such that the lens portion 40 is directed to the surface side of the upper case 72 (the opposite side to the display screen 70 side). Then, the external connection portion of the wiring substrate 10 extending from the lens unit 30 to the outside is connected to the mounting substrate of the mobile phone 2.

In the mobile phone 2 of the present embodiment, since the above camera module 1 is built in, miniaturization and a lower cost can be attained.

What is claimed is:

1. A camera module, comprising:
   a wiring substrate having a connection pad provided on an upper surface thereof;
   an imaging device mounted on the upper surface of the wiring substrate; and
   a lens unit provided on the wiring substrate with a lower surface of the lens unit arranged to be opposed to the upper surface of the wiring substrate, the lens unit being equipped with a lens portion arranged over the imaging device, an actuator for driving the lens portion, an outer frame portion for supporting the lens unit and the actuator and a projected connection terminal, made of a metal, provided on a lower surface of the outer frame portion and extending downward from the lower surface of the lens unit outer frame portion and electrically connected to the actuator, wherein a whole of a horizontal section of the projected connection terminal is provided to the lower surface of the outer frame portion;
   wherein the projected connection terminal of the outer frame portion is arranged opposed to the connection pad provided on the upper surface of the wiring substrate, and the connection pad and the projected connection terminal are joined electrically by a conductive adhesive agent,
   and a projection portion protruded downward is formed in a lower surface of the outer frame portion, and the projected connection terminal is formed on a lower surface of the projection portion, and
   a notched stepped portion is formed in an upper surface of the wiring substrate, and the connection pad is formed in a bottom surface of the notched stepped portion, and the projection portion is fitted into the notched stepped portion, and
   the projected connection portion is electrically connected to the connection pad.

2. A camera module according to claim 1,
   wherein the connection pad is arranged on a bottom portion of a recess portion provided in the bottom surface of the notched stepped portion of the wiring substrate, and the conductive adhesive agent is filled in the recess portion on the connection pad.

3. A camera module according to claim 1,
   wherein the conductive adhesive agent is a conductive paste or a solder.

4. A camera module according to claim 1,
   wherein an image processing device for processing image information of the imaging device is further mounted on the wiring substrate, and the image processing device is electrically connected to the connection pad.

5. A camera module according to claim 1,
   wherein the actuator is a voice coil motor that is constructed by a coil and a magnet, and the projected connection terminal of the lens unit is electrically connected to the coil.

6. A mobile terminal unit equipped with the camera module set forth in any one of claims 1 to 5.

* * * * *